(12) United States Patent
Hayashi

(10) Patent No.: US 7,786,668 B2
(45) Date of Patent: Aug. 31, 2010

(54) ORGANIC EL DEVICE

(75) Inventor: Kenji Hayashi, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 54 days.

(21) Appl. No.: 12/359,696

(22) Filed: Jan. 26, 2009

(65) Prior Publication Data

US 2009/0200930 A1      Aug. 13, 2009

(30) Foreign Application Priority Data

Feb. 13, 2008    (JP)    ............... 2008-031429

(51) Int. Cl.
*H01J 1/62*    (2006.01)
(52) U.S. Cl. .................. 313/504; 313/506; 313/512
(58) Field of Classification Search ......... 313/504–506, 313/512
See application file for complete search history.

(56) References Cited

U.S. PATENT DOCUMENTS

| 6,819,044 B2 * | 11/2004 | Shirakawa et al. .......... 313/506 |
| 7,291,970 B2 | 11/2007 | Kuwabara |
| 2003/0227021 A1 | 12/2003 | Yamazaki et al. |

FOREIGN PATENT DOCUMENTS

| JP | A-2000-223280 | 8/2000 |
| JP | A-2003-178880 | 6/2003 |
| JP | A-2004-63461 | 2/2004 |
| JP | A-2005-100943 | 4/2005 |
| JP | A-2006-222071 | 8/2006 |
| JP | A-2006-261058 | 9/2006 |
| JP | A-2007-5324 | 1/2007 |
| JP | A-2007-141750 | 6/2007 |
| JP | A-2007-147814 | 6/2007 |
| JP | A-2007-157606 | 6/2007 |
| JP | A-2007-234819 | 9/2007 |
| JP | A-2008-59867 | 3/2008 |

* cited by examiner

*Primary Examiner*—Vip Patel
(74) *Attorney, Agent, or Firm*—Oliff & Berridge, PLC

(57) ABSTRACT

An organic EL device includes an element region having a plurality of light-emitting elements, each including a first electrode disposed on a substrate body, a functional layer disposed above the first electrode, and a second electrode disposed above the functional layer; an enclosing member which surrounds the element region, covers the peripheral sides of the functional layers contained at least in the light-emitting elements located closest to the outer periphery of the substrate body among the plurality of light-emitting elements, and is disposed on the substrate body; a conductive member placed outside the enclosing member; and a connecting conductive member which is connected to the conductive member, extends from outside of the enclosing member over the enclosing member, and is connected to the second electrode. The connecting conductive member has a thickness larger than the thickness of the second electrode.

10 Claims, 4 Drawing Sheets

ORGANIC EL DEVICE

BACKGROUND

1. Technical Field

The present invention relates to an organic EL device.

2. Related Art

Organic electroluminescence devices (hereinafter referred to as "organic EL devices") having organic luminescent layers are known. An organic EL device includes a plurality of light-emitting elements composed of materials including organic materials. Each light-emitting element has a basic structure in which an organic luminescent layer is sandwiched between an anode and a cathode (for example, refer to JP-A-2007-234819).

Furthermore, in an element region in which a plurality of light-emitting elements are disposed, partition walls which define the light-emitting elements are provided, and an outermost peripheral partition wall is provided as an "enclosing member" which surrounds the element region. In a non-display region referred to as a "frame portion" located in the periphery of the element region, a cathode line connected to the cathode of each light-emitting element is arranged. The cathode line is disposed so as to electrically connect the cathode to the connecting terminal portion of the organic EL device. The cathode of the light-emitting element usually extends from inside of the element region over the enclosing member to the frame portion, where the cathode is connected to the cathode line.

In the existing organic EL device, when the cathode line and the cathode of the light-emitting element are connected to each other, the cathode (electrode) of the light-emitting element extends over the enclosing member and is connected to the conductive member on the substrate. Therefore, depending on the angle between the outer side surface of the enclosing member and the surface of the substrate, there is a possibility that defects, such as insufficient coverage of the electrode and cracks, may occur in the vicinity of the position where the outer side surface of the enclosing member rises from the surface of the substrate, resulting in disconnection between the electrode and the conductive member.

SUMMARY

An advantage of some aspects of the invention is that it provides an organic EL device in which, when an electrode of a light-emitting element inside an enclosing member is connected to a conductive member outside the enclosing member, disconnection between the electrode and the conductive member can be prevented.

According to an aspect of the invention, an organic EL device includes an element region having a plurality of light-emitting elements, each including a first electrode disposed on a substrate body, a functional layer disposed above the first electrode, and a second electrode disposed above the functional layer; an enclosing member which surrounds the element region, covers the peripheral sides of the functional layers contained at least in the light-emitting elements located closest to the outer periphery of the substrate body among the plurality of light-emitting elements, and is disposed on the substrate body; a conductive member placed outside the enclosing member; and a connecting conductive member which is connected to the conductive member, extends from outside of the enclosing member over the enclosing member, and is connected to the second electrode. The connecting conductive member has a thickness larger than the thickness of the second electrode.

In such a structure, the connecting conductive member having a thickness larger than the thickness of the second electrode is disposed so as to cover the outer side surface of the enclosing member on the outer peripheral side of the substrate body at the portion where the outer side surface rises from the substrate. Consequently, in comparison with the case where the second electrode extends from inside to outside of the enclosing member and is connected to the conductive member on the substrate as in the existing organic EL device, it is possible to suppress the occurrence of defects in the vicinity of the rising portion of the outer side surface of the enclosing member. Consequently, disconnection between the second electrode and the conductive member can be prevented.

In the organic EL device, preferably, the thickness of the connecting conductive member is 120 nm or more, and the thickness of the second electrode is 20 nm or less.

In this case, it is possible to more reliably prevent the occurrence of defects in the vicinity of the rising portion of the outer side surface of the enclosing member, and disconnection between the second electrode and the conductive member can be more reliably prevented.

Furthermore, in the organic EL device, preferably, the thickness of the enclosing member is 1 μm or more.

In this case, the element region and the region other than the element region can be reliably defined by the enclosing member. Furthermore, by providing sufficient insulation to the second electrode, it is possible to dispose, under the enclosing member, driving circuits, lines, etc. on the first electrode side.

Furthermore, in the organic EL device, preferably, the angle between the outer side surface of the enclosing member on the outer peripheral side of the substrate body and the surface of the substrate body is 20 to 70 degrees.

In this case, the angle of the outer side surface of the enclosing member does not become too gentle, and the width in the substrate body surface direction of the peripheral portion of the enclosing member does not increase more than necessary. Furthermore, the angle of the outer side surface of the enclosing member does not become too steep, and it is possible to prevent the occurrence of defects (disconnection) of the connecting conductive member in the vicinity of the portion where the outer side surface of the enclosing member rises from the surface of the substrate body.

Furthermore, in the organic EL device, preferably, the connecting conductive member is composed of a material having a lower ionization tendency than the material for the second electrode.

In this case, in comparison with the case where the second electrode is directly connected to the conductive member or a material having an ionization tendency equal to or higher than that of the second electrode is used as the material for the connecting conductive member, moisture can be prevented from infiltrating into the inside of the light-emitting elements, and thus degradation of the light-emitting elements can be prevented. Furthermore, since current concentrates on the conductive member, the occurrence of electromigration can be prevented during high-temperature operation.

Furthermore, in the organic EL device, preferably, the connecting conductive member is composed of aluminum.

In this case, in comparison with the case where the connecting conductive member is composed of a metal material such as silver, it is possible to form the connecting conductive member at low temperature, thereby facilitating manufacture and reducing the material cost.

Furthermore, in the organic EL device, preferably, the second electrode has a laminate structure including a metal thin film and a transparent conductive film.

In this case, in comparison with the case where the second electrode is composed of only a metal thin film, the thickness of the metal thin film can be decreased, and an increase in electrical resistance can be prevented while ensuring light transmittance.

Furthermore, preferably, the organic EL device further includes an electrode protection layer which covers the second electrode and the connecting conductive member, an organic buffer layer which is disposed on the electrode protection layer and covers the peripheral side surface of the enclosing member, and a gas barrier layer which covers the organic buffer layer and the electrode protection layer.

In this case, in the process of forming the organic buffer layer, the second electrode and the connecting conductive member are protected by the electrode protection layer, and thereby, the second electrode and the connecting conductive member can be prevented from being damaged. Consequently, the functional layers under the second electrode can also be prevented from being damaged. It is also possible to prevent the material of the organic buffer layer from affecting the second electrode and the connecting conductive layer. Furthermore, the organic barrier layer can reduce irregularities on the surface of the substrate body caused by the enclosing member, partition walls which separate the plurality of light-emitting elements for the individual pixels, the conductive member, etc. Thereby, the gas barrier layer can be formed flatly, and it is possible to improve the function of preventing moisture infiltration into the device by the gas barrier layer.

Furthermore, in the organic EL device, preferably, the contact angle at the end of the organic buffer layer is 20 degrees or less.

In this case, at the peripheral end of the organic buffer layer, the angle of the gas barrier layer disposed so as to cover the organic buffer layer does not become too steep, and thereby, the gas barrier layer can be prevented from being damaged at the peripheral end of the organic buffer layer.

Furthermore, in the organic EL device, preferably, the conductive member is continuously disposed in the shape of a strip so as to surround the enclosing member, and the connecting conductive member is disposed in the shape of a strip so as to extend along the extending direction of the enclosing member.

In this case, by increasing the connection area between each of the second electrode of the light-emitting elements and the conductive member and the connecting conductive member, the connection resistance can be decreased, and by increasing the cross section of each of the conductive member and the connecting conductive member, the electrical resistance can be decreased.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
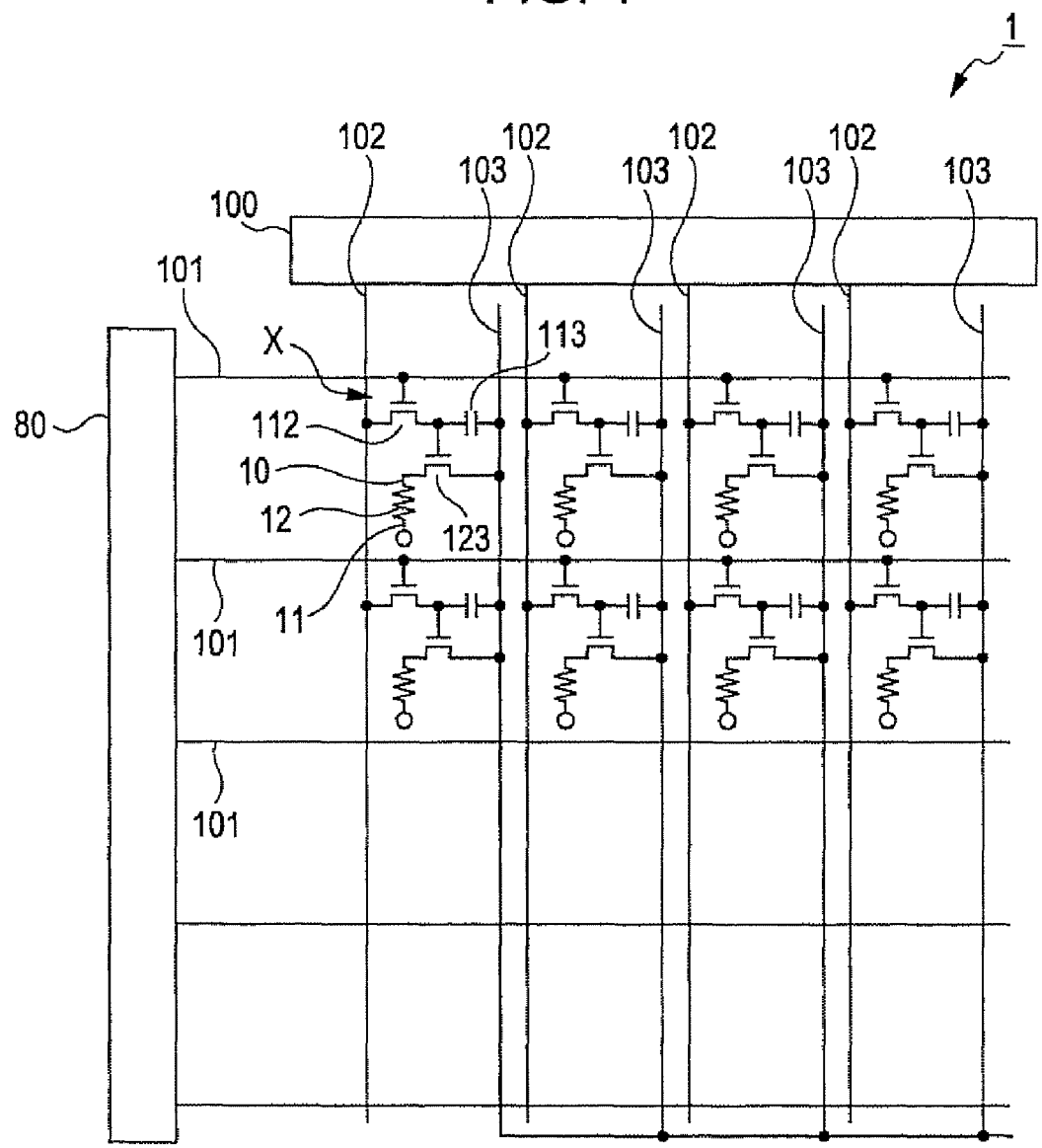
FIG. 1 is a schematic diagram showing a wiring structure of the organic EL device according to a first embodiment of the invention.

A first embodiment of the invention will be described with reference to the drawings. In the drawings, in order to make the individual layers and components recognizable, different scales are used for the individual layers and components.

FIG. 1 is a schematic diagram showing a wiring structure of an organic EL device according to the first embodiment. An organic EL device 1 is an active matrix-type device in which thin-film transistors (hereinafter referred to as "TFTs") are used as switching elements. The organic EL device 1 has a wiring structure in which a plurality of scanning lines 101, a plurality of signal lines 102 extending in a direction orthogonal to the scanning lines 101, and a plurality of power lines 103 extending parallel to the signal lines 102 are arranged. A sub-pixel X is disposed in the vicinity of each of the intersections of the scanning lines 101 and the signal lines 102.

The signal lines 102 are connected to a data line driving circuit 100 having shift registers, level shifters, video lines, and analog switches. The scanning lines 101 are connected to a scanning line driving circuit 80 having shift registers and level shifters.

Each sub-pixel X includes a switching TFT (switching element) 112 in which a scanning signal is supplied to the gate electrode through the scanning line 101, a storage capacitor 113 which stores a pixel signal supplied from the signal line 102 through the switching TFT 112, a driving TFT (switching element) 123 in which the pixel signal stored in the storage capacitor 113 is supplied to the gate electrode, an anode 10 into which driving current flows from the power line 103 when electrically connected to the power line 103 via the driving TFT 123, and a luminescent layer (organic luminescent layer) 12 sandwiched between the anode 10 and a cathode 11.

In the organic EL device 1, when the scanning line 101 is driven and the switching TFT 112 is turned on, the potential of the signal line 102 at that time is stored in the storage capacitor 113, and an on/off state of the driving TFT 123 is determined in accordance with a state of the storage capacitor 113. Current flows from the power line 103 into the anode 10 through the channel of the driving TFT 123, and then flows into the cathode 11 through the luminescent layer 12. The luminescent layer 12 emits light in accordance with the amount of the current flowing therethrough.

Figure 2:
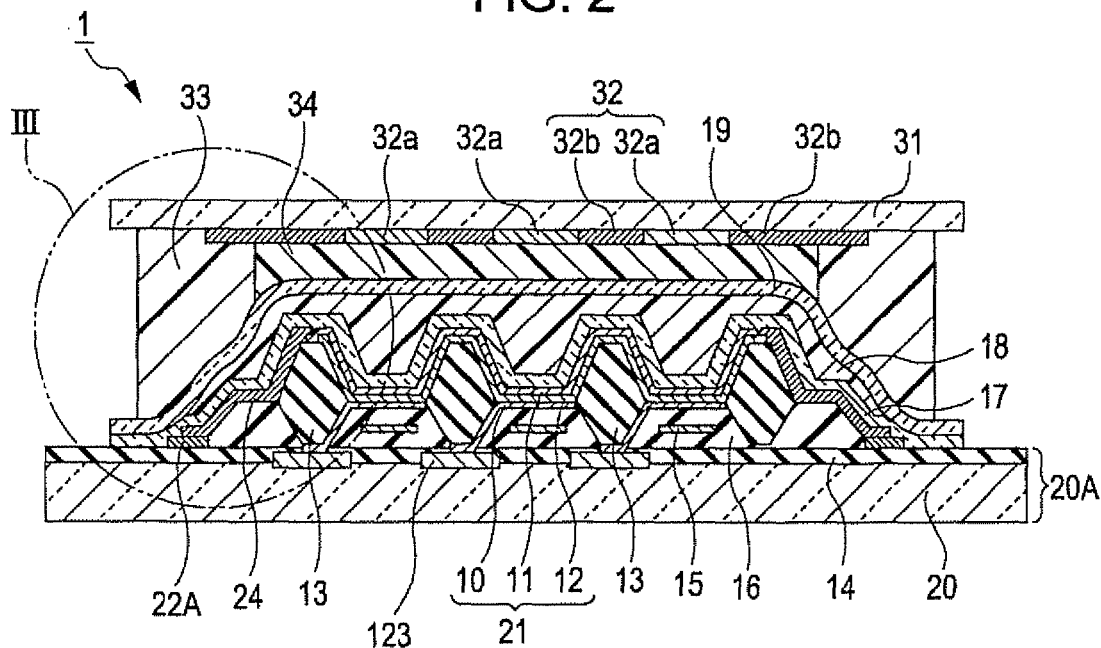
FIG. 2 is a schematic cross-sectional view showing a structure of the organic EL device according to the first embodiment of the invention.
Figure 3:
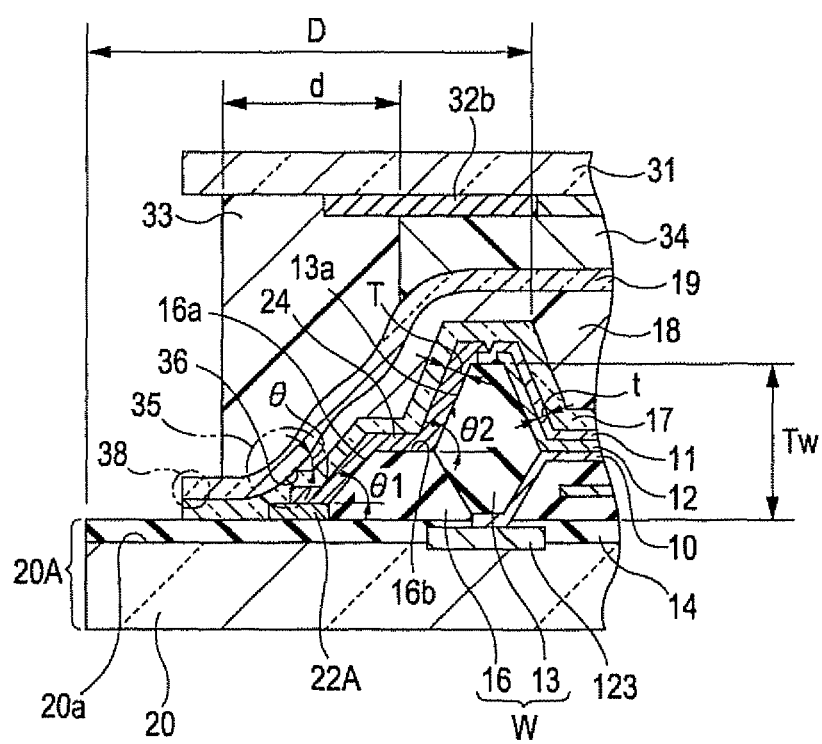
FIG. 3 is an enlarged sectional view of portion III in FIG. 2.
Figure 4:
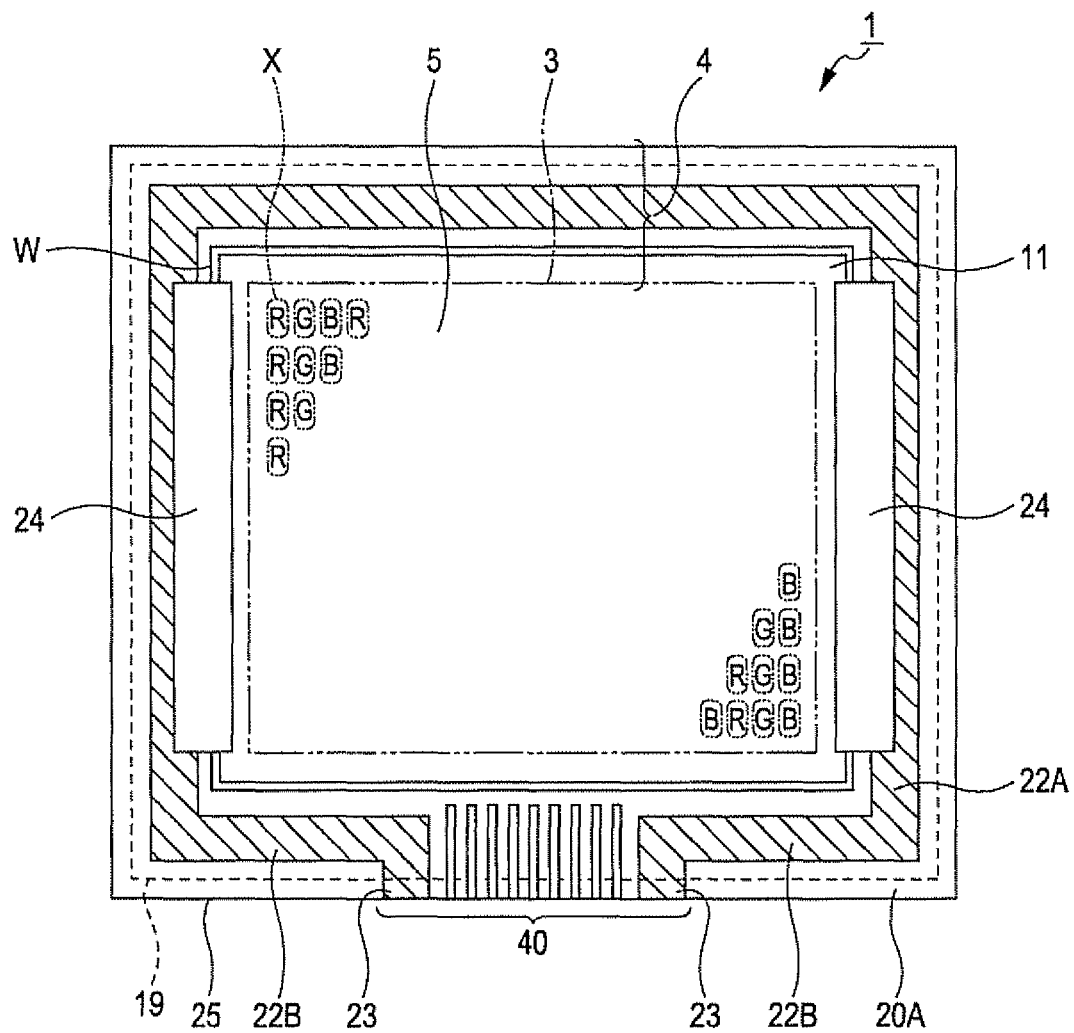
FIG. 4 is a schematic plan view showing a structure of the organic EL device according to the first embodiment of the invention.

The organic EL device 1 according to this embodiment will be specifically described below with reference to FIGS. 2 to 4. FIG. 2 is a schematic cross-sectional view showing the organic EL device 1. FIG. 3 shows an important portion (portion III) in FIG. 2 and is an enlarged sectional view showing a structure of a peripheral region of the organic EL device 1. FIG. 4 is a schematic plan view showing the structure of the organic EL device 1.

Referring to FIG. 2, the organic EL device 1 according to this embodiment is a "top-emission-type" organic EL device. In the top-emission-type device, since light is extracted from the opposing substrate side, not from the element substrate side, a large light-emitting area can be secured regardless of the sizes of the various circuits arranged on the element substrate, which is advantageous. Therefore, a desired luminance can be obtained while minimizing voltage and current, and the lifetime of the light-emitting elements can be prolonged.

The organic EL device 1 includes an element substrate 20A on which a plurality of light-emitting elements 21 are disposed, an electrode protection layer 17, an organic buffer layer 18, and a gas barrier layer 19 disposed so as to cover the plurality of light-emitting elements 21, and a protective substrate 31 which is disposed so as to face the surface of the element substrate 20A provided with the plurality of light-emitting elements 21. The element substrate 20A and the protective substrate 31 are bonded to each other through a sealing layer 33 and an adhesive layer 34. Hereinafter, the positional relationships and deposition relationships among the components will be described under the assumption that the side on which the element substrate 20A is disposed is a lower side, and the side on which the protective substrate 31 is disposed is an upper side.

The element substrate 20A includes a substrate body 20, the various lines and the TFT elements disposed on the substrate body 20, and an inorganic insulation film 14 which covers the lines and the TFT elements. The substrate body 20 may be a transparent substrate or a non-transparent substrate. Examples of the non-transparent substrate include a ceramic, such as alumina; a metal sheet composed of stainless steel or the like which has been subjected to insulation treatment, such as surface oxidation; and a thermosetting resin, a thermoplastic resin, and a film (plastic film) thereof. Examples of the material for the transparent substrate include inorganic substances, such as glass, quartz glass, and silicon nitride; and organic polymers (resins), such as an acrylic resin and a polycarbonate resin. Furthermore, a composite material produced by laminating or mixing the materials described above may be used as long as it has light transmittance. In this embodiment, glass is used as the material for the substrate body 20.

The driving TFTs 123 and various lines (not shown) are disposed on the substrate body 20, and the inorganic insulation film 14 is disposed over the entire surface of the substrate body 20 so as to cover these components. The inorganic insulation film 14 is composed of, for example, silicon oxide, such as $SiO_2$, or silicon nitride.

The element substrate 20A is provided with a planarizing layer 16 that reduces irregularities on the surface of the element substrate 20A caused by the lines, the TFT elements, etc.; the light-emitting elements 21 disposed on the planarizing layer 16; and a metal reflection layer 15 that reflects light emitted from each light-emitting element 21 toward the protective substrate 31 side. The planarizing layer 16 is composed of a resin material having an insulating property. Since the planarizing layer 16 is formed by photolithography, for example, a photosensitive acrylic resin or cyclic olefin resin is used as the material for the planarizing layer 16.

The metal reflection layer 15 is formed in the same manufacturing process as that for the lines, and therefore is composed of the same material as the wiring material, for example, a metal, such as aluminum, titanium, molybdenum, silver, or copper, or an alloy material thereof. The metal reflection layer 15 has a light-reflecting property. In this embodiment, the metal reflection layer 15 is composed of aluminum. The metal reflection layer 15 is disposed between each light-emitting element 21, which will be described below, and the substrate body 20 so as to overlie the light-emitting element 21 in plan view.

The light-emitting elements 21 are arrayed in the region that overlies the metal reflection layer 15 in plan view, and partition walls 13 are disposed between adjacent light-emitting elements 21 and between the outer peripheral end of the substrate body 20 and the light-emitting elements 21. The partition walls 13 are composed of a resin material having an insulating property as in the planarizing layer 16. Since the partition walls 13 are formed by photolithography, for example, a photosensitive acrylic resin or cyclic olefin resin is used as the material for the partition walls 13.

In each light-emitting element 21, a luminescent layer 12 constituting a functional layer is sandwiched between an anode (first electrode) 10 and a cathode (second electrode) 11. The anode 10 of the light-emitting element 21 is disposed on the planarizing layer 16 and connected to the driving TFT 123 provided on the element substrate 20A. A material having a high hole injection effect with a work function of 5 eV or more is suitably used for the anode 10. Examples of the material having a high hole injection effect include metal oxides, such as indium tin oxide (ITO). In this embodiment, ITO is used.

As the luminescent layer 12, a white luminescent layer that emits white light is employed. In this embodiment, the white luminescent layer is formed by vacuum deposition using a low molecular-weight light-emitting material. Examples of the white luminescent material include a luminescent material in which a styrylamine-based luminescent layer doped with an anthracene-based dopant (blue) and a styrylamine-based luminescent layer doped with a rubrene-based dopant (yellow) are allowed to emit light at the same time to realize white light emission.

Although not shown in the drawings, in this embodiment, a triarylamine polymer (ATP) layer (hole injection layer) and a triphenyldiamine (TPD) layer (hole transport layer) are deposited between the anode 10 and the luminescent layer 12, and an aluminum quinolinol (Alq3) layer (electron injection layer) and LiF (electron injection buffer layer) are deposited between the luminescent layer 12 and the cathode 11, thereby facilitating injection of electrons and holes from the respective electrodes. In this embodiment, the hole injection layer, the hole transport layer, the luminescent layer 12, the electron injection layer, and the electron injection buffer layer constitute the functional layer.

The cathode 11 covers the surfaces of the light-emitting elements 21 and the partition walls 13 and extends to the top of the partition wall 13 placed in the outermost periphery (on the side close to the outer periphery of the element substrate 20A). As the cathode 11, a thin film composed of a material having a high electron injection effect (with a work function of 4 eV or less) is suitably used. Examples of such a thin film include metal thin films, such as calcium, magnesium, sodium, and lithium thin films, and thin films of metal compounds of these metals or laminates of these thin films. Examples of the metal compounds include metal fluorides, such as calcium fluoride; metal oxides, such as lithium oxide; and organic metal complexes, such as calcium acetylacetonate. In the case of a metal material, the cathode 11 is formed by vacuum deposition, and in the case of a metal compound, the cathode 11 is formed by a high-density plasma deposition method, such as ECR plasma-enhanced sputtering, ion plating, or facing target sputtering. In order to obtain transparency, the total thickness of the cathode is preferably 100 nm or less, and more preferably 20 nm or less.

In the case of use in a large panel of 20 inch or more, the electrode performance may decrease only with the thin film composed of any of these materials because of high electrical resistance. Therefore, a transparent conductive film composed of a transparent metal oxide, such as ITO or tin oxide, with a thickness of 100 nm or less may be disposed so as to be in contact with the metal thin film, or separately from the cathode, an auxiliary line may be disposed by forming a metal layer composed of aluminum, gold, silver, copper, or the like by patterning so as to avoid light-emitting portions. In this embodiment, a magnesium-silver alloy (MgAg) film is formed at a thickness of about 10 nm.

In this embodiment, as shown in FIG. 3, a partition wall 13 and a planarizing layer 16 disposed in the outermost periphery of the element substrate 20A function as an enclosing member W which surrounds a display region 3 (refer to FIG. 4) of the organic EL device 1. Furthermore, the region surrounded by the enclosing member W corresponds to the element region 5 in which a plurality of light-emitting elements 21 are disposed. A first cathode line (conductive member) 22A is disposed on the element substrate 20A outside the enclosing member W in a region where the planarizing layer 16 is not disposed in the vicinity of the periphery of the element substrate 20A. The first cathode line 22A and the cathode 11 are electrically connected by a cathode connection layer (connecting conductive member) 24.

The first cathode line 22A is disposed for the purpose of electrically connecting the cathode 11 to a power supply (not shown), and is mainly disposed in the vicinity of the periphery of the element substrate 20A. As the material for forming the first cathode line 22A, a metal having high electrical conductivity, such as aluminum, titanium, molybdenum, tantalum, silver, or copper, or an alloy of two or more of these metals may be used. A single layer of any of these materials or a laminate of these metal layers may be used. As the outermost layer of the first cathode line 22A, an ITO film is disposed, which is the same material as that for the anode 10. By forming the ITO film as the outermost layer of the first cathode line 22A simultaneously with the formation of the anode 10, it is possible to prevent the first cathode line 22A from being corroded in the photolithography step in the manufacturing process. The first cathode line 22A has a thickness of about 300 to 800 nm, and a width of about 0.5 to 5 mm. The width of the first cathode line 22A is not limited to the above range because the width of the first cathode line 22A that can be formed varies depending on the size of the organic EL device 1. In this embodiment, for example, the first cathode line 22A has a width of about 1 mm.

The cathode connection layer 24 is composed of a metal having high electrical conductivity and is formed by vacuum deposition or sputtering through a mask. Preferably, the cathode connection layer 24 is composed of a material having a lower ionization tendency than the material of the cathode 11. For example, when magnesium is used as the cathode 11, aluminum can be used for the cathode connection layer 24.

As shown in FIG. 3, in the enclosing member W, the outer side surface on the peripheral side of the substrate body 20 has a step-like shape including the outer side surface 16a and the upper surface 16b of the planarizing layer 16 and the outer side surface 13a of the partition wall 13. The angle θ1 between the outer side surface 16a of the planarizing layer 16 constituting the enclosing member W and the surface 20a of the substrate body 20 is 20 to 70 degrees. Furthermore, the upper surface 16b of the planarizing layer 16 constituting the enclosing member W is substantially parallel to the surface 20a of the substrate body 20. The angle θ2 between the outer side surface 13a of the partition wall 13 constituting the enclosing member W and the surface 20a of the substrate body 20 is 20 to 70 degrees. The thickness Tw of the enclosing member W is, for example, about 1 μm or more.

The cathode connection layer 24 is connected to the first cathode line 22A outside the enclosing member W (on the peripheral side of the substrate body 20), extends from outside of the enclosing member W over the enclosing member W, and is connected to the cathode 11 at the top of the partition wall 13 constituting the enclosing member W. The thickness T of the cathode connection layer 24 is larger than the thickness t of the cathode 11. The thickness of the cathode connection layer 24 is, for example, about 120 nm or more. In this embodiment, the thickness T of the cathode connection layer 24 is about 300 nm.

An electrode protection layer 17 is disposed over the element substrate 20A so as to cover the end face of the first cathode line 22A and to cover the surfaces of the first cathode line 22A, the cathode connection layer 24, and the cathode 11. The electrode protection layer 17 can prevent the cathode 11 having a very small thickness of 20 nm or less and the luminescent layers 12 disposed thereunder from being damaged. The electrode protection layer 17 also functions as a gas barrier layer which prevents moisture infiltration into the light-emitting elements 21.

The electrode protection layer 17 can be formed using a high-density plasma-enhanced deposition method, such as ECR sputtering or ion plating. Before the formation of the electrode protection layer 17, preferably, oxygen plasma treatment is performed so that the adhesion of the resulting film is improved.

The electrode protection layer 17 is preferably composed of a silicon compound, such as silicon oxynitride or silicon nitride, in view of transparency, adhesion, water resistance, and gas barrier property. In particular, silicon oxynitride is preferable because it is possible to form a colorless, transparent film while maintaining high moisture-proofing property and controlling membrane stress by changing the ratio between oxygen and nitrogen contained in silicon oxynitride. In this embodiment, the electrode protection layer 17 is formed using silicon oxynitride.

The thickness of the electrode protection layer 17 is preferably 100 nm or more so that the material for the organic buffer layer 18 before curing is prevented from infiltrating into the cathode 11. The upper limit of the thickness of the electrode protection layer 17 is preferably set at 300 nm or less so that it is possible to prevent the occurrence of cracks due to stress caused by covering the partition walls 13.

The organic buffer layer 18 is disposed on the electrode protection layer 17 inside the electrode protection layer 17 (on the center side of the device). The organic buffer layer 18 is arranged so as to fill in irregularities of the electrode protection layer 17 which has an irregular shape due to the shapes of the enclosing member W and the partition walls 13. The upper surface of the organic buffer layer 18 is substantially flat. In the peripheral region, the organic buffer layer 18 is disposed so as to reduce the irregularities mainly resulting from the enclosing member W. In the peripheral region of the organic buffer layer 18, the organic buffer layer 18 is formed so as to follow the step-like outer side surface of the enclosing member W. Furthermore, the organic buffer layer 18 is formed such that the thickness decreases from the device center to the peripheral end 35. Furthermore, in the peripheral region of the organic buffer layer 18, the organic buffer layer 18 is formed so as to follow the step-like underlying shape such that the angle of elevation of the inclined surface of the organic buffer layer 18 with respect to the direction of the surface 20a of the substrate body 20 does not sharply increase from the peripheral end 35 to the upper side of the enclosing member W.

Referring to FIG. 3, the angle of elevation (contact angle) θ of the organic buffer layer 18 with respect to the direction of the surface 20a of the substrate body 20 at the peripheral end 35 is preferably 20 degrees or less. In this embodiment, the angle of elevation θ is, for example, about 10 degrees.

As the material for forming the organic buffer layer 18, an organic compound material which has high fluidity, which does not contain a solvent or a volatile component, and which can be entirely used as a raw material for a polymer skeleton is preferably used. An epoxy monomer/oligomer having an epoxy group and having a molecular weight of 3,000 or less can be suitably used. Here, a material having a molecular weight of 1,000 or less is defined as a monomer, and a material having a molecular weight of 1,000 to 3,000 is defined as an oligomer. Examples thereof include bisphenol A epoxy oligomers, bisphenol F epoxy oligomers, phenol novolac epoxy oligomers, polyethylene glycol diglycidyl ether, alkyl glycidyl ether, 3,4-epoxycyclohexenylmethyl-3',4'-epoxycyclohexene carboxylate, and ε-caprolactone-modified 3,4-epoxycyclohexylmethyl-3',4'-epoxycyclohexane carboxylate. These are used alone or in combination of two or more.

Furthermore, a curing agent which reacts with the epoxy monomer/oligomer is incorporated into the material for forming the organic buffer layer 18. As such a curing agent, an agent which forms a cured film having excellent electrical insulation property and adhesion, high hardness and toughness, and excellent heat resistance is suitably used. An addition polymerization type is preferred because of excellent transparency and low variation in curing. Preferred examples of such a curing agent include acid anhydride curing agents, such as 3-methyl-1,2,3,6-tetrahydrophthalic anhydride, methyl-3,6-endomethylene-1,2,3,6-tetrahydrophthalic anhydride, 1,2,4,5-benzenetetracarboxylic dianhydride, and 3,3',4,4'-benzophenonetetracarboxylic dianhydride. The material for forming the organic buffer layer 18 to which such a curing agent is added acts as an excellent thermosetting resin.

When a very small amount of an alcohol having a high molecular weight and low volatility, such as 1,6-hexanediol, or an amine compound, such as aminephenol, is used as a reaction accelerator which accelerates reaction (ring opening) of an acid anhydride, low-temperature curing is easily performed. Curing is performed by heating in the range of 600° C. to 100° C. The cured film is composed of a polymer having an ester bond.

Furthermore, a cation-emission-type photopolymerization initiator, which is often used for reducing curing time, may be used. However, the initiator preferably slowly reacts so as to prevent rapid curing shrinkage. Preferably, the cured product is finally formed by heat curing so that planarization proceeds by decreasing the viscosity by heating after coating. Furthermore, additives, for example, a silane coupling agent for improving adhesion with the cathode 11 and the gas barrier layer 19, a desiccant such as an isocyanate compound, and fine particles for preventing shrinkage during curing, may be mixed.

Each of these raw materials preferably has a viscosity of 1,000 mPa·s or more (room temperature: 25° C.). The reason for this is to prevent the materials from infiltrating into the luminescent layers 12 immediately after coating and generating non-light-emitting regions referred to as dark spots. The viscosity of the buffer layer-forming material containing these raw materials is preferably 2,000 mPa·s or more (room temperature). Furthermore, the water content in the buffer layer-forming material is preferably adjusted to 10 ppm or less.

The optimum thickness of the organic buffer layer 18 is preferably 2 to 5 μm. As the thickness of the organic buffer layer 18 increases, the gas barrier layer 19 is more easily prevented from being damaged when foreign matter is mixed. However, when the total thickness including the thickness of the organic buffer layer 18 exceeds 15 μm, the distance between color layers 32a, which will be described below, and the luminescent layers 12 increases to increase leakage of light from the side surfaces, thereby decreasing the light extraction efficiency.

The gas barrier layer 19 is disposed on the organic buffer layer 18 so as to cover the entire surface including the end of the organic buffer layer 18 and cover the entire surface of the electrode protection layer 17. The gas barrier layer 19 prevents infiltration of oxygen and moisture, and is preferably composed of a nitrogen-containing silicon compound, such as silicon nitride or silicon oxynitride, in view of transparency, gas barrier property, and water resistance. In this embodiment, the gas barrier layer 19 is formed using silicon oxynitride.

The gas barrier layer 19 can be formed using a high-density plasma-enhanced deposition method, such as ECR sputtering or ion plating. Before the formation of the gas barrier layer 19, preferably, the layer-forming surface is subjected to oxygen plasma treatment so that the adhesion of the resulting film is improved. Furthermore, the thickness of the gas barrier layer 19 is preferably 100 nm or more in order to prevent the damage to the gas barrier layer 19 and secure the gas barrier property. Furthermore, the thickness of the gas barrier layer 19 is preferably 800 nm or less in order to prevent cracks from occurring when irregularities, such as the end of the organic buffer layer 18 and the first cathode line 22A, are covered. Furthermore, the electrode protection layer 17 and the gas barrier layer 19 are disposed so as to cover the first cathode line 22A. An ITO film (oxide conductive film), which is used for the anode 10 as described above, is disposed on the surface of the first cathode line 22A.

Furthermore, the gas barrier layer 19 is formed wider than the organic buffer layer 18 so that the organic buffer layer 18 is completely covered. The sealing layer 33 is disposed on the gas barrier layer 19. As shown in FIG. 3, a rising portion 36 of the peripheral end 35 of the organic buffer layer 18 is located within the width d of the sealing layer 33.

The organic buffer layer 18 and the gas barrier layer 19 disposed thereon are formed using different materials with different coefficients of thermal expansion. The sealing layer 33 is disposed so as to overlie the peripheral end 35 of the organic buffer layer 18, and the gas barrier layer 19 is sandwiched between organic materials. Furthermore, the width of the electrode protection layer 17 is larger than the width of the organic buffer layer 18. Since the electrode protection layer 17 is usually formed using the same mask as that of the gas barrier layer 19, the width of the electrode protection layer 17 is the same as the width of the gas barrier layer 19.

The protective substrate 31 is disposed so as to face the element substrate 20A provided with the gas barrier layer 19. The protective substrate 31 has a function of protecting the gas barrier layer 19 and light transmittance. Examples of the material that can be used for forming the protective substrate 31 include inorganic substances, such as glass, quartz glass, and silicon nitride; and organic polymers (resins), such as an acrylic resin, a polycarbonate resin, a polyethylene terephthalate resin, and a polyolefin resin. Furthermore, a composite material produced by laminating or mixing the materials described above may be used as long as it has light transmittance. In particular, a glass substrate is preferably used in view of high transparency and moisture-proofing property and from the standpoint that the protective substrate 31 has the same coefficient of thermal expansion as the element substrate 20A so that heat resistance is imparted.

A color filter layer 32 is disposed on the surface, which faces the element substrate 20A, of the protective substrate 31. In the color filter layer 32, color layers 32a which modulate transmitted light into any one of red (R) Tight, green (G) light, and blue (B) light are arrayed in a matrix. Each of the color layers 32a is arranged so as to face the corresponding while luminescent layer 12 disposed on the anode 10. Therefore, light emitted from the luminescent layers 12 is transmitted through the corresponding color layers 32a and emitted as red light, green light, or blue light toward a viewer, thus performing color display.

A black matrix layer 32b which prevents light leakage and improves visibility is disposed between adjacent color layers 32a and in the periphery of the color layers 32a. Some part of the black matrix layer 32b extends to a region that overlies the sealing layer 33 in plan view so that light leakage from the sides of the device can be efficiently prevented and thus image quality can be improved.

The element substrate 20A and the protective substrate 31 are bonded to each other by the sealing layer 33, which is disposed in the vicinity of the outer periphery of the element substrate 2A, and the adhesive layer 34, which is sandwiched between the element substrate 20A and the protective substrate 31 in the region surrounded by the sealing layer 33.

In addition to the function of preventing moisture from infiltrating into the device, the sealing layer 33 also has a function of improving the positional accuracy of bonding between the element substrate 20A and the protective substrate 31 and functions as a wall that prevents the overflow of the adhesive layer 34. As the material for forming the sealing layer 33, a resin material which is cured by ultraviolet light to increase its viscosity is used. Preferably, an epoxy monomer/oligomer having an epoxy group and having a molecular weight of 3,000 or less is used. Examples thereof include bisphenol A epoxy oligomers, bisphenol F epoxy oligomers, phenol novolac epoxy oligomers, polyethylene glycol diglycidyl ether, alkyl glycidyl ether, 3,4-epoxycyclohexenylmethyl-3',4'-epoxycyclohexene carboxylate, and $\epsilon$-caprolactone-modified 3,4-epoxycyclohexylmethyl-3',4'-epoxycyclohexane carboxylate. These are used alone or in combination of two or more.

Furthermore, a curing agent which reacts with the epoxy monomer/oligomer is incorporated into the material for forming the sealing layer 33. As such a curing agent, a photoreaction-type initiator which initiates cationic polymerization is preferably used. Examples thereof include diazonium salts, diphenyliodonium salts, triphenyl sulfonium salts, sulfonate esters, iron arene complexes, and silanol/aluminum complexes. The sealing layer-forming material including such a curing agent acts as a photocurable (ultraviolet-curable) resin.

Preferably, the viscosity of the sealing layer-forming material during coating is 30 to 100 Pa·s (room temperature). Furthermore, when an additive having cation-holding capacity is used so that the viscosity gradually increases after ultraviolet irradiation, it is possible to eliminate a light irradiation step after bonding, and the bonding step is facilitated because the sealing layer-forming material does not easily flow. Moreover, even with a small sealing width of 1 mm or less, rupture of the sealing layer 33 can be prevented, and overflowing of the filler after bonding can be prevented, thus being preferable. Furthermore, the water content of the sealing layer-forming material is preferably adjusted to 1,000 ppm or less.

Usually, the material for forming the sealing layer 33 is often incorporated with filling materials, such as spherical particles (spacers) with a predetermined particle size for controlling the distance between the substrates, and scaly or bulky inorganic materials (inorganic fillers) for adjusting the viscosity. However, there is a possibility that such filling materials may damage the gas barrier layer 19 during pressure-bonding. Therefore, in this embodiment, a sealing layer-forming material that does not contain such filling materials is used. The thickness of the sealing layer 33 is preferably 10 to 20 µm.

The adhesive layer 34 is filled closely without a space in the region surrounded by the sealing layer 33, fixes the protective substrate 31 disposed so as to face the element substrate 20A, has a buffer function against mechanical impact from outside, and has a function of protecting the luminescent layers 12 and the gas barrier layer 19.

The material for forming the adhesive layer 34 contains as a main component an organic compound material which has high fluidity and which does not contain a volatile component, such as a solvent. Preferably, an epoxy monomer/oligomer having an epoxy group and having a molecular weight of 3,000 or less is used. Examples thereof include bisphenol A epoxy oligomers, bisphenol F epoxy oligomers, phenol novolac epoxy oligomers, polyethylene glycol diglycidyl ether, alkyl glycidyl ether, 3,4-epoxycyclohexenylmethyl-3', 4'-epoxycyclohexene carboxylate, and $\epsilon$-caprolactone-modified 3,4-epoxycyclohexylmethyl-3',4'-epoxycyclohexane carboxylate. These are used alone or in combination of two or more.

Furthermore, a curing agent which reacts with the epoxy monomer/oligomer is incorporated into the material for forming the adhesive layer 34. As such a curing agent, an agent which forms a cured film having excellent electrical insulation property, high toughness, and excellent heat resistance is suitably used. An addition polymerization type is preferred because of excellent transparency and low variation in curing. Preferred examples of such a curing agent include acid anhydride curing agents, such as 3-methyl-1,2,3,6-tetrahydrophthalic anhydride, methyl-3,6-endomethylene-1,2,3,6-tetrahydrophthalic anhydride, 1,2,4,5-benzenetetracarboxylic dianhydride, and 3,3',4,4'-benzophenonetetracarboxylic dianhydride; and polymers thereof. The material for forming the adhesive layer 34 to which such a curing agent is added acts as a thermosetting resin.

The adhesive layer-forming material is cured by heating in the range of 60° C. to 100° C., and the cured film is a polymer containing an ester bond and excellent in adhesion with silicon oxynitride. Furthermore, an amine curing agent, such as an aromatic amine or an aliphatic amine, may be used. An adhesive layer-forming material that does not contain filling materials, such as spacers and an organic filler, is used for the same reason as the sealing layer-forming material.

The viscosity of the adhesive layer-forming material during coating is preferably 200 to 1,000 mPa·s (room temperature) in view of the filling ability of the material into the space after bonding. A material in which the viscosity decreases immediately after heating and then curing starts is preferably used. Furthermore, in the adhesive layer-forming material, the water content is preferably adjusted to 1,000 ppm or less.

The thickness of the adhesive layer 34 is preferably in the range of 3 to 10 µm. If the thickness of the adhesive layer 34 exceeds such a range, the total thickness of the thickness of the adhesive layer 34 and the thicknesses of the individual layers, such as the organic buffer layer 18, described above becomes about 15 µm at a maximum. If the total thickness exceeds 15 µm, the distance between the color filter layer 32 and the light-emitting elements 21 becomes excessively large, and the ratio of light escaping to the side of the device to light emitted from the light-emitting elements 21 increases, resulting in a decrease in light extraction efficiency. The thickness of the layer is controlled by adjusting the amount of the adhesive layer-forming material to be arranged.

The peripheral region of the organic EL device 1 is the frame portion corresponding to the non-light-emitting region. The frame portion extends, for example, from the top of the partition wall 13 placed in the outermost periphery of the element substrate 20A to the end of the element substrate 20A. Referring to FIG. 3, the width D of the frame portion is, for example, 2 mm, and the width d of the sealing layer 33 is, for example, 1 mm.

A planar structure of the organic EL device 1 will now be described with reference to FIG. 4 which is a schematic plan view. The element substrate 20A has a rectangular shape in plan view, and includes a display region 3 arranged in the center of the substrate body 20 and a frame portion 4 arranged in the periphery of the display region 3.

The display region 3 has a rectangular shape in plan view, and the sub-pixels X shown in FIG. 1 are arrayed in a matrix. In each sub-pixel X, the light-emitting element 21 is arranged, and any one of red (R) light, green (G) light, and blue (B) light is extracted. The sub-pixels X which emit light of any one of these colors are arrayed so that the sub-pixels X of the same color are arranged in the short side direction, which is referred to as a stripe arrangement. A group of sub-pixels X emitting three different color lights RGB constitutes a unit pixel, and in the unit pixel, RGB color lights emitted are mixed so as to perform full color display. The size of the display region 3 is about 4 inch diagonally.

The frame portion 4 includes a cathode 11 which covers the display region 3 and has a larger area than the display region 3 (so as to protrude to the frame portion 4), the cathode 11 having a rectangular shape in plan view, a first cathode line 22A disposed so as to surround the periphery of the cathode 11, second cathode lines 22B connected to the first cathode line 22A, and strip-like cathode connection layers 24 which are disposed on both short sides of the cathode 11 and connect the cathode 11 and the first cathode line 22A. Furthermore, a side 25, which is one of the long sides of the element substrate 20A, is provided with a mounting terminal portion 40 used for electrically connecting the element substrate 20A to another member.

An enclosing member W is disposed so as to surround the display region 3. The region inside the enclosing member W corresponds to the element region 5 where a plurality of light-emitting elements 21 are disposed. The cathode connection layers 24 extend in a strip shape on both short sides of the cathode 11 along the direction where the enclosing member W extends.

The first cathode line 22A is disposed in a U-shape in plan view so as to face both short sides of the cathode 11 and a long side of the cathode 11 opposite the side 25. The second cathode lines 22B are disposed in an L-shape in plan view, and each end of the first cathode line 22A is connected to an end of the corresponding second cathode line 22B. A connecting terminal portion 23 is provided on the other end of the corresponding second cathode line 22B. The connecting terminal portions 23 constitute parts of the mounting terminal portion 40 and extend to the side 25.

The mounting terminal portion 40 is connected to various lines provided on the organic EL device 1 and circuit wiring (not shown). The mounting terminal portion 40 is used for electrically connecting the organic EL device 1 to another member. The conductivity of the mounting terminal portion 40 may be increased by performing plating with a highly conductive metal, such as gold or silver, according to need.

A gas barrier layer 19 is disposed so as to cover these lines except for the end of the mounting terminal portion 40. The region not covered with the gas barrier layer 19 (exposed region) includes the connecting terminal portions 23 constituting parts of the mounting terminal portion 40. The bend sections of the second cathode lines 22B are covered with the gas barrier layer 19.

The operation of the organic EL device 1 according to this embodiment will now be described. As shown in FIG. 3, the outer side surface of the enclosing member W is formed in the shape of a step due to the outer side surface 16a and the upper surface 16b of the planarizing layer 16 and the outer side surface 13a of the partition wall 13. Therefore, in the case where lines, etc. are formed so as to extend over the enclosing member W, disconnection may easily occur due to the occurrence of defects, such as insufficient coverage and cracks, in the vicinity of the boundary between the first cathode line 22A on the element substrate 20A and the outer side surface 16a of the planarizing layer 16.

However, in the organic EL device 1 according to this embodiment, as described above, the thickness T of the cathode connection layer 24 is larger than the thickness t of the cathode 11. Therefore, in comparison with the case where the cathode 11 extends to outside of the enclosing member W and is directly connected to the first cathode line 22A, defects, such as insufficient coverage and cracks, do not easily occur in the vicinity of the boundary between the first cathode line 22A and the outer side surface 16a of the planarizing layer 16. At the same time, the occurrence of defects can be prevented in the vicinity of the boundary between the outer side surface 16a and the upper surface 16b of the planarizing layer 16 and in the vicinity of the boundary between the upper surface 16b of the planarizing layer 16 and the outer side surface 13a of the partition wall 13. Consequently, according to this embodiment, defects can be made difficult to occur in the cathode connection layer 24, and disconnection between the cathode 11 and the first cathode line 22A can be prevented.

Furthermore, the thickness t of the cathode 11 is about 10 nm, which is in the range of 20 nm or less, while the thickness T of the cathode connection layer 24 is about 300 nm, which is in the range of 120 nm or more. By setting the thickness T of the cathode connection layer 24 to be significantly larger than the cathode 11 in such a manner, the occurrence of defects can be more reliably prevented, and disconnection between the cathode 11 and the first cathode line 22A can be more reliably prevented.

Furthermore, the angle $\theta_1$ between the outer side surface 16a of the planarizing layer 16 constituting the enclosing member w and the surface 20a of the substrate body 20 is 20 to 70 degrees, and the angle $\theta_2$ between the outer side surface 13a of the partition wall 13 and the surface 20a of the substrate body 20 is 20 to 70 degrees. By setting the angles $\theta_1$ and $\theta_2$ at 20 degrees or more, the width of the periphery of the enclosing member W in the surface 20a direction of the substrate body 20 does not increase more than necessary. Furthermore, by setting the angles $\theta_1$ and $\theta_2$ at 70 degrees or less, it is possible to prevent the outer side surface 16a of the planarizing layer 16 and the outer side surface 13a of the partition wall 13, which constitute the outer side surface of the enclosing member W, from rising at a steep angle more than necessary, and thus the occurrence of defects in the cathode connection layer 24 can be prevented.

Furthermore, in the case where the thickness Tw of the enclosing member W is 1 μm or more, the element region 5 and the region other than the element region 5 can be defined reliably. Although disconnection due to the defects may easily occur, since the cathode connection layers 24 having the structure described above are used, it is possible to prevent defects, thus preventing disconnection.

Furthermore, when the cathode connection layer 24 is composed of a material having a lower ionization tendency than the material of the cathode 11, the material between the first cathode line 22A and the cathode 11 is not easily corroded compared with the case where the cathode 11 is directly connected to the first cathode line 22A or a material having an ionization tendency equal to or higher than the ionization tendency of the cathode 11 is used. Consequently, it is possible to prevent moisture from infiltrating into the light-emitting elements 21 due to the corrosion of the material between the first cathode line 22A and the cathode 11.

Furthermore, by forming the cathode connection layer 24 using aluminum, the cathode connection layer 24 can be formed at low temperature compared with the case where the cathode connection layer 24 is formed using a metal material such as silver, thus facilitating manufacture and reducing the material cost.

When the cathode 11 has a structure in which a transparent conductive film is laminated on a metal thin film, in comparison with the case where the cathode 11 is composed of a metal thin film alone, it is possible to decrease the thickness of the metal thin film and to suppress an increase in electrical resistance while ensuring the light transmittance of the cathode 11.

Furthermore, by forming the electrode protection layer 17 so as to cover the cathode 11 and the cathode connection layers 24, the cathode 11 and the cathode connection layers 24 are protected by the electrode protection layer 17 in the process of forming the organic buffer layer 18, and thus it is possible to prevent the cathode 11 and the cathode connection layers 24 from being damaged. This can also prevent the functional layers under the cathode 11 from being damaged. Furthermore, it is possible to prevent the material for the organic buffer layer 18 before curing from infiltrating into the cathode 11 and the cathode connection layers 24.

Furthermore, the electrode protection layer 17 and the gas barrier layer 19 are formed so as to cover the first cathode line 22A, and an ITO film (oxide conductive film) is formed on the surface of the first cathode line 22A. Since ITO has a polycrystalline columnar structure in the process of film formation, the ITO film has many voids, and moisture easily infiltrates thereinto. When heat treatment is performed in order to increase the conductivity of the ITO film, crystal grains aggregate/grow, thus further increasing the number of voids. Therefore, if the first cathode line 22A is exposed, there is a possibility that moisture, such as water vapor in the external environment, may infiltrate into the organic EL device 1 through the ITO film on the surface of the first cathode line 22A. However, in this embodiment, since the first cathode line 22A is covered with a layer composed of a silicon compound having low moisture permeability, infiltration of moisture through the first cathode line 22A can be prevented, and the display performance can be maintained by avoiding decrease in display performance due to degradation of the light-emitting elements 21.

Furthermore, the organic buffer layer 18 can relax the stress caused by warpage and volume expansion of the element substrate 20A, and can prevent the electrode protection layer 17 from separating from the partition walls 13. Furthermore, the organic buffer layer 18 can reduce irregularities on the element substrate 20A. Thereby, the gas barrier layer 19 can be formed flatly, and stress concentration points are eliminated, and thus the occurrence of cracks can be prevented. Consequently, it is possible to improve the function of preventing moisture infiltration into the device by the gas barrier layer 19.

The angle of elevation θ of the organic buffer layer 18 at the peripheral end 35 with respect to the horizontal direction of the element substrate 20A is 20 degrees or less. In this embodiment, the angle of elevation θ is 10 degrees. Thereby, at the peripheral end 35 of the organic buffer layer 18, the angle of the gas barrier layer 19 disposed so as to cover the organic buffer layer 18 is prevented from becoming steep. Consequently, in the gas barrier layer 19 covering the peripheral end 35 of the organic buffer layer 18, damages, such as cracks and separation, due to stress concentration can be prevented.

The gas barrier layer 19 can also suppress the degradation, etc. of the light-emitting elements 21 due to oxygen and moisture. Furthermore, since the gas barrier layer 19 completely covers the organic buffer layer 18, it is also possible to prevent moisture infiltration through the organic buffer layer 18.

The organic buffer layer 18 and the gas barrier layer 19 disposed thereon are composed of materials having different coefficients of thermal expansion. Therefore, when the temperatures of these layers are changed by heat generation due to changes in the environment or driving of the device, there is a possibility that the gas barrier layer 19 may be broken due to the difference in coefficient of thermal expansion. Such breakage tends to occur at the end of the organic buffer layer 18 where the shape of the gas barrier layer 19 changes. However, in this embodiment, the sealing layer 33 is disposed so as to overlie the peripheral end 35 of the organic buffer layer 18, and the gas barrier layer 19 is sandwiched between organic materials. Thereby, in the gas barrier layer 19, damages, such as cracks and separation, due to stress concentration can be prevented. Consequently, moisture is preventing from reaching the light-emitting elements 21 through the first cathode line 22A and the organic buffer layer 18, and generation of dark spots can be prevented.

In this embodiment, the protective substrate 31 is provided so as to face the gas barrier layer 19. Therefore, the protective substrate 31 can prevent the breakage of the gas barrier layer 19, and the function of preventing moisture infiltration into the device by the gas barrier layer 19 can be maintained. Furthermore, the protective substrate 31 itself can prevent moisture infiltration.

Furthermore, in this embodiment, the materials for forming the sealing layer 33 and the adhesive layer 34 do not contain a filling material, such as a spacer or an inorganic filler, in the form of particles. Therefore, when the element substrate 20A and the protective substrate 31 are pressure-bonded to each other, the gas barrier layer 19 can be avoided from being damaged due to transmission of pressure-bonding stress to the gas barrier layer 19 via a filling material.

Second Embodiment

A second embodiment of the invention will be described with reference to FIGS. 1 to 3 and newly to FIG. 5. An organic EL device according to the second embodiment differs from the organic EL device 1 described in the first embodiment in that a cathode connection layer 24B is disposed continuously along three sides of the enclosing member W. Otherwise, the second embodiment is the same as the first embodiment. Consequently, the same components or parts as those of the first embodiment are designated by the same reference numerals, and description thereof is omitted.

Figure 5:
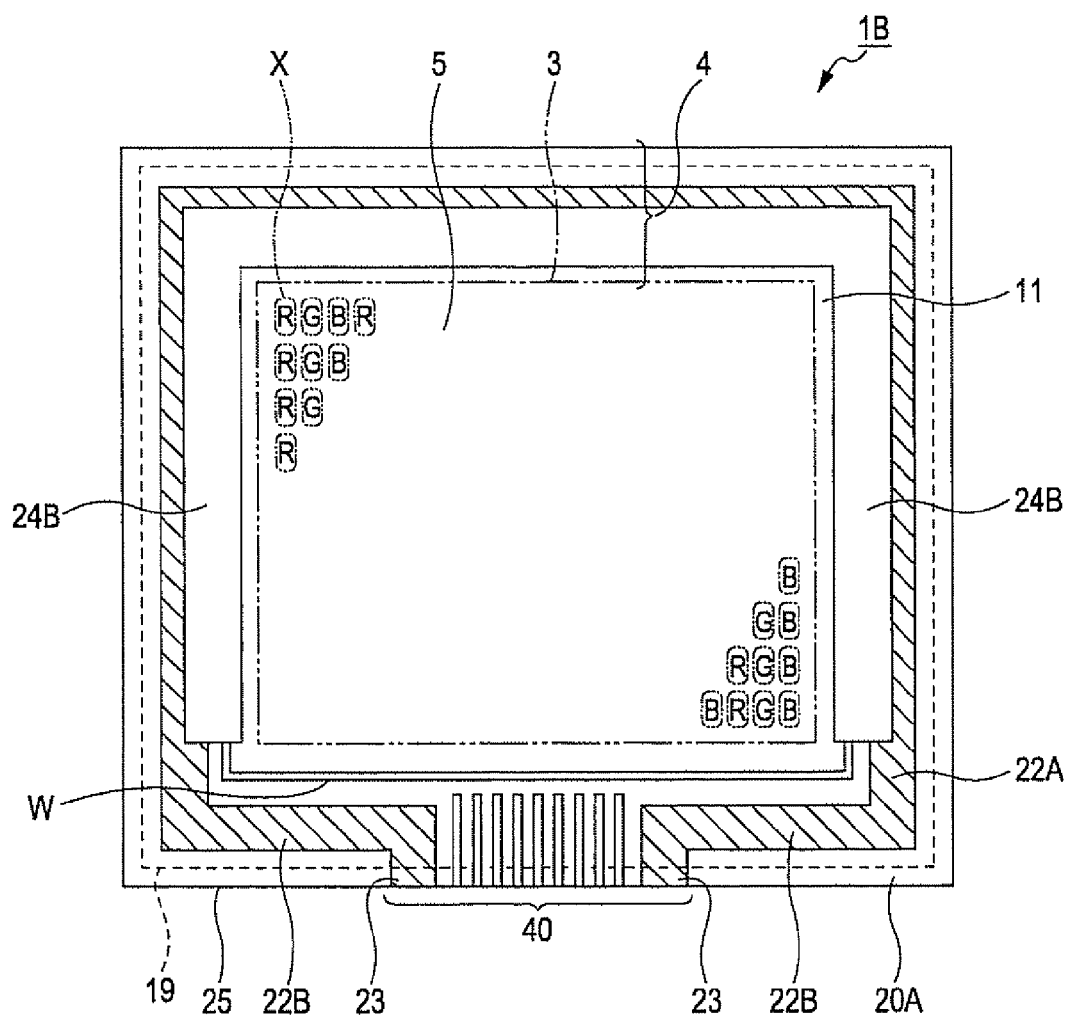
FIG. 5 is a schematic plan view showing a structure of an organic EL device according to a second embodiment of the invention.

As shown in FIG. 5, in an organic EL device 1B according to this embodiment, the cathode connection layer 24B extends like a strip along three sides of the enclosing member W. Thereby, the connection area between each of the cathode 11 of the light emitting elements 21 and the first cathode line 22A and the cathode connection layer 24B can be increased, resulting in a decrease in connection resistance, and the cross section of the cathode connection layer 24B can be increased, resulting in a decrease in electrical resistance.

It is to be understood that the invention is not limited to the embodiments described above, and various modifications can be made as long as they do not deviate from the scope of the invention.

For example, according to the spirit of the invention, it is not essential to employ the active matrix in which TFTs etc. are used. Even when the invention is implemented using an element substrate for a passive matrix device and passive matrix driving is performed, the same advantages can be obtained at low cost.

Furthermore, the distance between the metal reflection layer and the luminescent layer may be controlled for each of RGB pixels so that RGB luminous efficiency can be enhanced.

Furthermore, since the organic EL device according to each of the embodiments described above is of top emission type, the anode does not necessarily have light transmittance, and a metal electrode composed of aluminum or the like that does not transmit light may be provided. In such a case, since the anode reflects light and also functions as the metal reflection layer, the metal reflection layer may be omitted.

In the embodiments described above, a low molecular-weight light-emitting material is used. However, the luminescent layers may be formed using a high molecular-weight light-emitting material. Furthermore, a three-layer structure may be used in which the compositions of the individual layers are changed and three color lights, i.e., red color light, green color light, and blue color light, are simultaneously emitted so that white light is extracted.

In the embodiments described above, the electrode protection layer has a single-layer structure. However, the electrode protection layer may have a laminate structure including a plurality of layers. For example, the electrode protection layer may include a lower layer having low modulus of elasticity and an upper layer having high water resistance.

In the embodiments described above, the gas barrier layer is formed wider than the outer periphery of the sealing layer. However, it is not always necessary to form the gas barrier layer wider than the sealing layer, and the gas barrier layer may be formed within the width of the sealing layer as in the peripheral end of the organic buffer layer.

In the embodiments describe above, the gas barrier layer has a single-layer structure. However, the gas barrier layer may have a laminate structure including a plurality of layers.

Furthermore, the protective substrate may be provided with, in addition to the color filter layer, a functional layer, such as a layer which blocks or absorbs ultraviolet light, a light reflection prevention film, or a heat-dissipating layer.

In the embodiments described above, the sealing layer-forming material does not contain a filling material in the shape of particles. However, in a structure in which the sealing layer is not in contact with the organic buffer layer, it may be possible to mix spherical particles composed of an organic material having a low modulus of elasticity such that the gas barrier layer is not damaged.

The entire disclosure of Japanese Patent Application No. 2008-031429, filed Feb. 13, 2008 is expressly incorporated by reference herein.

What is claimed is:

1. An organic EL device comprising:
an element region having a plurality of light-emitting elements, each including a first electrode disposed on a substrate body, a functional layer disposed above the first electrode, and a second electrode disposed above the functional layer;
an enclosing member which surrounds the element region, covers the peripheral sides of the functional layers contained at least in the light-emitting elements located closest to the outer periphery of the substrate body among the plurality of light-emitting elements, and is disposed on the substrate body;
a conductive member placed outside the enclosing member; and
a connecting conductive member which is connected to the conductive member, extends from outside of the enclosing member over the enclosing member, and is connected to the second electrode,
wherein the connecting conductive member has a thickness larger than the thickness of the second electrode.

2. The organic EL device according to claim 1, wherein the thickness of the connecting conductive member is 120 nm or more, and the thickness of the second electrode is 20 nm or less.

3. The organic EL device according to claim 1, wherein the thickness of the enclosing member is 1 μm or more.

4. The organic EL device according to claim 1, wherein the angle between the outer side surface of the enclosing member on the outer peripheral side of the substrate body and the surface of the substrate body is 20 to 70 degrees.

5. The organic EL device according to claim 1, wherein the connecting conductive member is composed of a material having a lower ionization tendency than the material for the second electrode.

6. The organic EL device according to claim 1, wherein the connecting conductive member is composed of aluminum.

7. The organic EL device according to claim 1, wherein the second electrode has a laminate structure including a metal thin film and a transparent conductive film.

8. The organic EL device according to claim 1, wherein the organic EL device includes an electrode protection layer which covers the second electrode and the connecting conductive member, an organic buffer layer which is disposed on the electrode protection layer and covers a peripheral side surface of the enclosing member, and a gas barrier layer which covers the organic buffer layer and the electrode protection layer.

9. The organic EL device according to claim 8, wherein the contact angle at the end of the organic buffer layer is 20 degrees or less.

10. The organic EL device according to claim 1, wherein the conductive member is continuously disposed in the shape of a strip so as to surround the enclosing member, and the connecting conductive member is disposed in the shape of a strip so as to extend along the extending direction of the enclosing member.

* * * * *